United States Patent [19]

Chu et al.

[11] 3,798,079

[45] Mar. 19, 1974

[54] TRIPLE DIFFUSED HIGH VOLTAGE TRANSISTOR

[75] Inventors: Chang Kwei Chu, Pittsburgh; Surinder Krishna, Greensburg, both of Pa.

[73] Assignee: Westinghouse Electric Corporation, Pittsburgh, Pa.

[22] Filed: June 5, 1972

[21] Appl. No.: 259,404

[52] U.S. Cl. .......... 148/33.5, 148/187, 317/235 AN
[51] Int. Cl. .......... H01l 3/14
[58] Field of Search ...... 148/33.5, 187; 317/235 AN

[56] References Cited

UNITED STATES PATENTS

| | | | |
|---|---|---|---|
| 3,260,624 | 7/1966 | Wiesner | 148/175 |
| 3,615,932 | 10/1971 | Makimoto et al. | 148/175 |
| 3,397,326 | 8/1968 | Gallagher et al. | 317/235 AN X |
| 3,488,235 | 1/1970 | Walczak et al. | 148/33.5 |
| 3,511,724 | 5/1970 | Ohta | 148/187 |
| 3,513,040 | 5/1970 | Kaye et al. | 148/33.5 X |
| 3,591,430 | 7/1971 | Schlegel | 148/33.5 X |

OTHER PUBLICATIONS

Vora, "A Self-Isolation Scheme for I.C.S.", IBM J. Res. Dev., Vol. 15, No. 6, pp. 430–435.

*Primary Examiner*—L. Dewayne Rutledge
*Assistant Examiner*—J. Davis
*Attorney, Agent, or Firm*—C. L. Menzemer

[57] ABSTRACT

A high voltage transistor with improved surge voltage capacity is formed in a silicon semiconductor body of thickness of at least 4 mils and having two opposed major surfaces and a resistivity of at least 30 ohm-centimeters. A collector region adjoins a major surface and is comprised of three portions: The first collector portion adjoins a PN junction and has a substantially uniform dopant concentration therethrough corresponding to the resistivity of the body to support a desired reverse breakdown voltage. The second collector portion adjoins the major surface and has a dopant concentration of at least $1 \times 10^{19}$ atoms per cubic centimeter at said surface and a steep dopant concentration gradient to provide for good ohmic and thermal contact properties. The third collector portion is intermediate the first and second collector portions and has higher dopant concentrations than said first collector portion, but lower than said second collector portion, and has a shallower dopant concentration gradient that said second collector portion to support a reverse breakdown surge voltage through the transistor.

Preferably the transistor is the PNP type made by simultaneously diffusing boron and gallium and/or aluminum into the major surface of a silicon wafer or body having a given concentration level of N-type dopant therethrough. Thus the various portions of the collector region are simultaneously formed.

4 Claims, 8 Drawing Figures

TRIPLE DIFFUSED HIGH VOLTAGE TRANSISTOR

FIELD OF THE INVENTION

The present invention relates to semiconductor devices and particularly transistors. It is useful in providing a transistor with very high voltage capacity, e.g., 1,000 to 3,000 volts, at normal operating temperatures.

BACKGROUND OF THE INVENTION

Junction transistors are old and well known in the art. They have emitter and collector regions formed by one conductive type of impurity, and a base region formed by the opposite conductive type of impurity. The emitter and collector regions adjoin opposite major surfaces of a semiconductor body and the base region is partially in the interior portion of the semiconductor between the emitter and collector regions. Thus, two PN junctions are formed, one by the transition from the emitter to base regions and one by the transition from the collector to base regions.

The voltage capacity of a transistor is directly dependent on the reverse breakdown voltage (called the "avalanche breakdown voltage" or "breakover voltage") across the PN junction between the base and collector regions. The voltage capacity is generally increased by reducing the dopant concentration in the collector region; however, this change also increases the resistivity of the collector region. The current capacity of the transistor is therefore proportionally reduced and the power capacity of the transistor substantially unchanged.

Various proposals have been made to obtain high voltage capacity in the transistor without a corresponding reduction in current capacity. One such proposal, set forth in U.S. Pat. No. 3,507,714, is to shift the carrier depletion region into the base region by decreasing the dopant concentration of the base region adjoining the collector region while increasing the dopant concentration of the collector region so that the bias voltage is primarily supported in the base region rather than the collector region. This proposal reduces the saturation voltage (emitter to collector) and in turn maintains to some extent the current capacity of the transistor; however, the current capacity of the transistor and specifically the maximum current density can be increased by increasing the dopant concentration in the base region adjoining the emitter region, but this change reduces the injection efficiency and minority carrier lifetime in the transistor.

Another proposal was simply to increase the dopant concentration in the collector region adjoining the ohmic contact with that region and away from the PN junction with the base region. Thus, the resistivity of the collector region and in turn the saturation voltage (emitter to collector) of the transistor are reduced while maintaining the breakover voltage. However, the region of high doping concentration cannot be extended into the collector region without reducing the breakover voltage; the dopant concentration gradient in the highly doped region is too steep to support any appreciable part of the bias voltage.

By way of explanation, it should be noted that the dopant concentration gradient is the change in dopant concentration with a change in distance from a reference point such as a surface or junction of the transistor. A steep gradient is one which has relatively large and abrupt changes in dopant concentrations with changes in distance. A steep gradient requires a correspondingly steep electric field gradient to support a given voltage. A shallow gradient is one which has relatively small and gradual changes in dopant concentrations with changes in distance. It requires a correspondingly shallow electric field gradient to support a given voltage. The shallower the electric field intensity gradient, the higher the reverse breakdown voltage of a semiconductor device; see, e.g., Valoric et al., "Avalanche Breakdown Voltage in Silicon Diffused P-N Junctions as a Function of Impurity Gradient" J. App. Phys., Vol. 227, pp. 895–899 (Aug., 1956).

The mere high doping of the surface portion of the collector region caused added difficulties because of the sharp transition from the lowly doped portion of the collector region to the highly doped portion. When a transistor is switched off or on a surge of voltage much greater than the on-state voltage is sometimes encountered through the transistor. The surge can damage the transistor unless allowance is made for it in the transistor's design. But even where allowance is made, the sharp transition from the lowly doped to the highly doped portion of the collector region has been found not to support the voltage under surge conditions. This proposal was not, therefore, a satisfactory one for producing a high voltage transistor for use in applications involving surge conditions.

The present invention overcomes these difficulties and problems of high voltage transistors and provides a readily made transistor with relatively low saturation voltage and improved surge voltage capacity.

SUMMARY OF THE INVENTION

A transistor having improved surge characteristics is provided that is particularly adaptable, where desired, for high reverse breakdown voltage capacity, e.g., 1,000 volts, at normal operating temperatures. The transistor has a collector region with high surface concentrations for low ohmic resistance and high thermal conductivity, yet has a shallow internal concentration gradient needed to support high breakover voltage and particularly those presented by surge conditions.

A silicon semiconductor wafer or body of thickness of from 4 to 12 mils and having opposed major surfaces is selected which has a given doping level therethrough. The doping level is chosen by the corresponding resistivity of greater than 30 ohms-cms needed for the required reverse breakdown voltage, e.g., 80 to 100 ohms-cms for 1,000 volts.

The semiconductor body has emitter and collector regions adjoining the opposed major surfaces and base region in interior portion partially between the emitter and collector region. The collector region comprises three portions: The first collector portion adjoins the base region and has a substantially uniform dopant concentration therethrough corresponding to the given level of dopant through the semiconductor body. The second collector portion adjoins the major surface and has a dopant concentration at the surface of greater than about $1 \times 10^{19}$ atoms/cm$^3$ and a steep dopant concentration gradient. The third collector portion is intermediate the first and second collector portions and has lower dopant concentrations than the second collector portion but higher than the first collector portion, and a shallower dopant concentration than the second collector portion.

The dopant concentrations and widths of the first, second and third collector portions are selected to provide the desired electrical characteristics in the transistor. The first collector portion provides the breakover voltage capacity under on-state operation and should therefore be wide enough for the uniform dopant concentration selected to support the carrier depletion region under on-state conditions. The second collector portion provides good ohmic and thermal properties at the surface and reduces the saturation voltage (emitter to collector) of the collector region, and should therefore have high dopant concentrations. The third intermediate collector region provides the breakover voltage capacity under surge or switching conditions, and should therefore have a shallow dopant concentration gradient and be of sufficient width to support the carrier depletion region under those conditions while contiguously adjoining both the first and the second collector portions.

The transistor may be made by either diffusion or epitaxial growth. Preferably, the transistor is a PNP type made by diffusion. The various portions of the collector region can thereby be simultaneously formed by simultaneously diffusion boron and gallium and/or aluminum into a semiconductor body having a given dopant level therethrough corresponding to the desired concentration in the first collector portion. The procedure for performing and controlling such simultaneous diffusion of boron and gallium is described fully in copending application Ser. No. 218,097, filed Jan. 17, 1972 and assigned to the same assignee as the present invention. Similar procedures are used for the simultaneous diffusion of boron and aluminum. The result is that the second collector portion comprises essentially boron and the third collector portion comprises essentially gallium and/or aluminum. This preferred embodiment has the added advantage of a low diffusion cycle time during manufacture by virtue of the fast diffusion rate of the two component diffusion of boron with gallium and/or aluminum.

Other details, objects and advantages of the invention will become apparent as the following description of a present preferred embodiment thereof and a present preferred method of practicing the same proceeds.

BRIEF DESCRIPTION OF THE DRAWINGS

In the accompanying drawings, the present preferred embodiment of the invention and the present preferred methods of making the invention are illustrated in which:

FIG. 7 is a cross-sectional view through the center of a finished PNP transistor.

DESCRIPTION OF THE PREFERRED EMBODIMENTS

Figure 1:
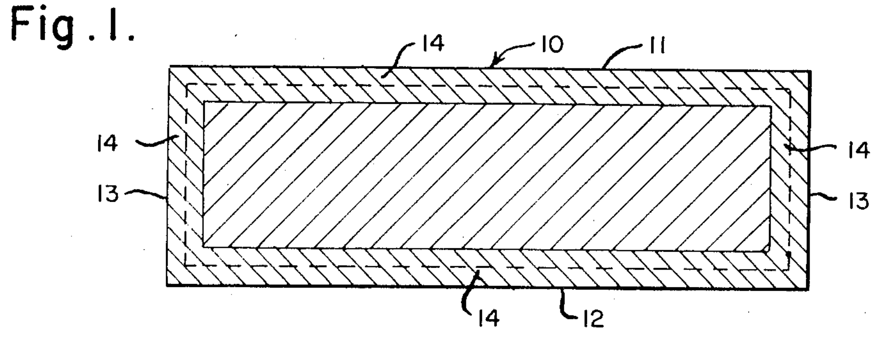
FIGS. 1–7 show a cross-sectional view through the center of a PNP transistor in various stages of manufacture.

Referring to FIG. 1, a circular silicon semiconductor wafer or body 10 of a thickness of 4 to 12 mils, preferably about 8 mils, has a given level of P-type dopant concentration therethrough corresponding to a resistivity of greater than 30 ohms-cms and preferably greater than about 80 ohms-cm. Body 10 is disposed in a diffusion furnace, and has simultaneously diffused into opposed major surfaces 11 and 12 and curvilinear side surfaces 13 boron and gallium and/or aluminum to form P+ dopant region 14 adjoining said surfaces and a P− dopant portion throughout the remainer of the body. The diffusion is preferably performed in an inert atmosphere, e.g., argon, in a closed or open quartz tube, e.g., at about 1,235°C. for about 30 minutes. If a closed tube is used, solid diffusion sources are necessarily used; if an open tube is used, gas diffusion sources are preferably used where possible.

By way of explanation, it should be noted that a plus (+) dopant region is a region having a dopant concentration at least one order of magnitude greater than a related region having a dopant concentration of the same type dopant. For example, a P+ dopant region would have a doping concentration of P-type impurity of $1 \times 10^{20}$ atoms/cm$^3$ or greater for a related P-dopant region with a P-type doping concentration of $1 \times 10^{19}$ atoms/cm$^3$. Conversely, a minus (−) dopant is a region having a dopant concentration at least one order of magnitude less than a related region having a dopant concentration of the same type dopant. For example, a P− dopant region would have a doping concentration of P-type impurity of $1 \times 10^{18}$ atoms/cm$^3$ or less for a related P− dopant region with a P-type doping concentration of $1 \times 10^{19}$ atoms/cm$^3$.

P+ dopant region 14 divides itself by virtue of the diverse diffusion rates between boron and gallium and/or aluminum into first and second dopant portions 15 and 16. First dopant portion 15 adjoins the surfaces and has a steep dopant concentration gradient ranging from about $2.5 \times 10^{21}$ atoms/cm$^4$ (a 40 micron depth diffusion of $1 \times 10^{19}$ atoms/cm$^3$ surface concentration) to about $1.0 \times 10^{24}$ atoms/cm$^4$ (a 10 micron depth diffusion of $1 \times 10^{21}$ atoms/cm$^3$ surface concentration) and a high dopant concentration, i.e., greater than about $1 \times 10^{19}$ atoms/cm$^3$, at the surfaces. Second contiguous dopant portion 16 adjoins the P− dopant portion and has a shallower dopant concentration gradient than first portion 15, e.g., about $1.3 \times 10^{20}$ atoms/cm$^4$ (a 75 micron depth diffusion of $1 \times 10^{18}$ atoms/cm$^3$ surface concentration) to about $5 \times 10^{21}$ atoms/cm$^4$ (a 20 micron depth diffusion of $1 \times 10^{19}$ atoms/cm$^3$ surface concentration), and lower dopant concentrations than first portion 15 but higher than P− dopant portion, e.g., ranging from about $1 \times 10^{14}$ to $1 \times 10^{17}$ atoms/cm$^3$.

Relative widths of first dopant portion 15 to second dopant portion 16 can be controlled to provide the desired electrical characteristics and specifically surge voltage capacity. The ratio of the width of first dopant portion 15 to the width of second dopant portion 16 is controlled by varying the ratio of the concentration of boron to the concentration of gallium and/or aluminum. If a closed tube is used, the ratio is governed by saturation conditions in the tube, and the saturation conditions are a function of the temperature and pressure in the tube. With standard pressure, the temperature can range from the minimum temperature to vaporize the particular diffusion sources (e.g., about 1,100°C.) to the temperature at which the semiconductor body 10 becomes plastic (e.g., about 1,325°C.). Maximum dopant concentrations are achieved in the closed tube when contact is achieved with maximum dopant concentrations at the surfaces. It is therefore preferred that closed tube diffusion be performed as near 1,235°C. as practicable. Most desirably, however, the open tube technique is used because it provides greater flexibility in controlling the ratio of boron to gallium and/or aluminum. With the open tube, the ratio is not limited to the saturation conditions which can be obtained, but can be varied to provide the desired electrical characteristics in the transistor.

Figure 2:
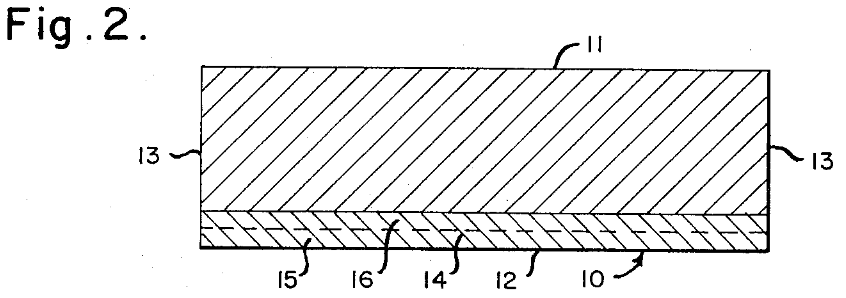

Referring to FIG. 2, P+ dopant region 14 is removed from the portions of semiconductor body 10 adjoining major surface 11 and side surfaces 13. To accomplish this, major surface 12 is masked by an etchant resistant coating and the other surfaces etched by procedures well known in the art. A suitable etchant is an acid solution such as one having 15 parts nitric acid, 5 parts acetic acid and 3 parts hydrofluoric acid by weight. The masking coating thereafter is removed from surface 12 and surface 12 cleaned, e.g., by lap etching.

Figure 3:
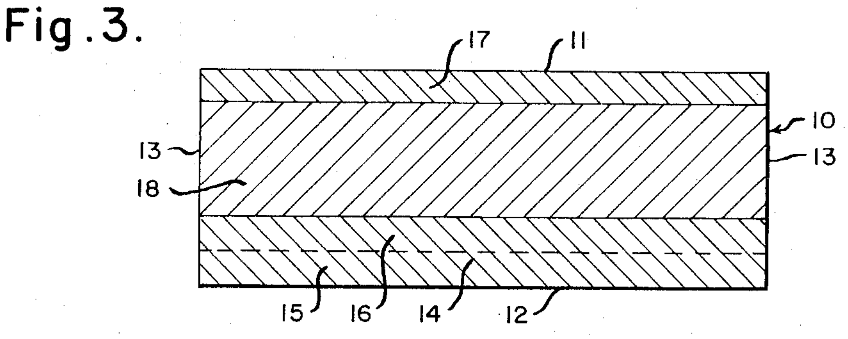

Referring to FIG. 3, body 10 has N-dopant region 17 formed therein adjoining major surface 11. The surfaces of the body may be selectively masked, e.g., with oxide coating, leaving major surface 11 exposed. Body 10 is then disposed in a diffusion furnace and a vapor of an N-type impurity producing compound, such as phosphine gas, in an inert atmosphere established in the furnace. The N-type dopant, preferably phosphorus, is thereby diffused through major surface 11 into body 10 to form N-dopant region 17. Meanwhile the diffusion step also drives P+ dopant region 14 further into body 10. It should be noted that although it may de desirable to mask surface 12 during this diffusion step, its masking is not necessary; the concentration of N-type impurity is several orders of magnitude lower than the surface concentration of P+ dopant region 14 so that it does not adversely affect the concentration of the region to an appreciable degree.

Figure 4:
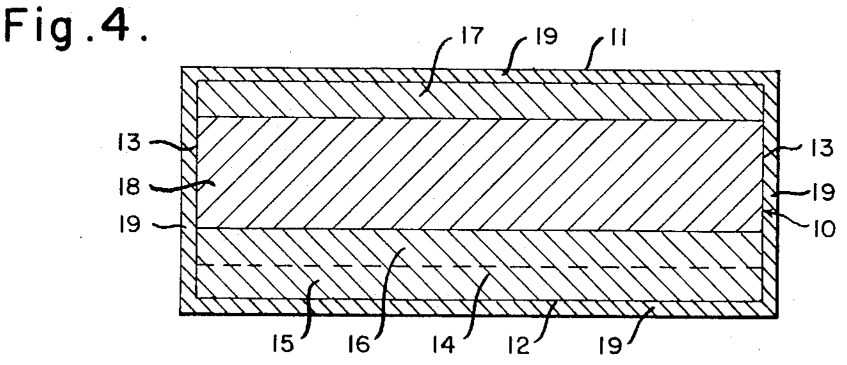

Referring to FIG. 4, a diffusion resistant coating, 19, e.g., silicon oxide, is formed on the surfaces of body 10. To effect this, the body can be heated in an oxygen-rich atmosphere such as steam for several minutes. Preferably, however, coating 19 is formed simultaneously with the diffusion of N-dopant region 17 by carrying out the diffusion step in an oxygen containing atmosphere.

Figure 5:
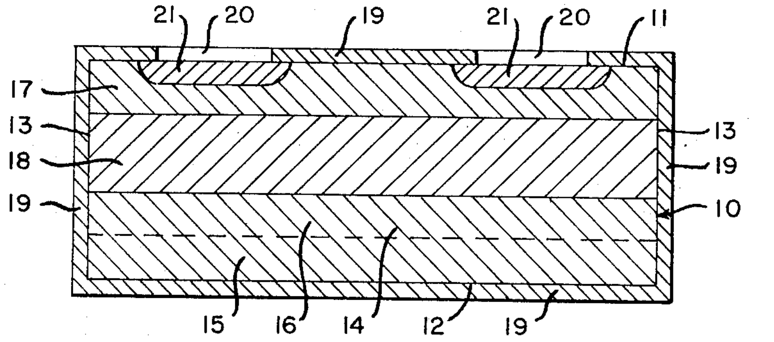

As shown in FIG. 5, second P+ dopant region 21 is then formed in semiconductor body 10 adjoining selected portions of major surface 11. Annular window 20 is provided in coating 19 by selectively masking the unselected portions of the surfaces with an etchant resistant coating (not shown) of a kind shown in the art, and etching away the remaining (selected portions) of coating 19. Thereafter, body 10 is disposed in a diffusion furnace and a vapor of P-type impurity producing compound, such as boron oxide or boric acid, in an inert atmosphere established in the furnace. P-type dopant is thereby diffused through window 20 into body 10 to form annular-shaped P+ dopant region 21 adjoining the selected portions of body 10. It should be noted that during this diffusion step, P+ dopant region 14 and N-dopant region 17 are driven further into body 10.

Figure 6:
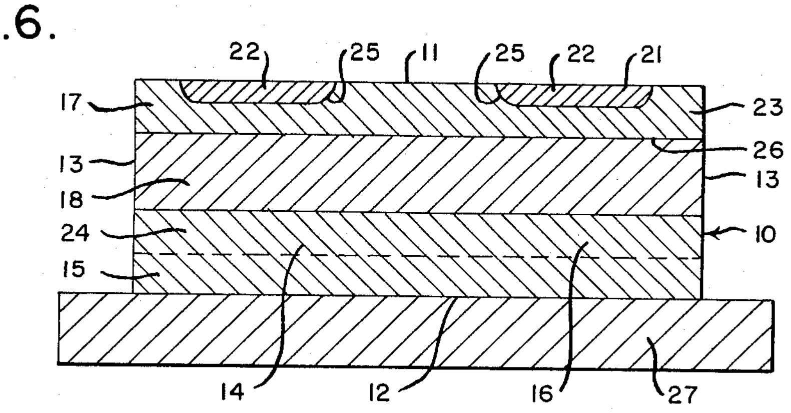

Referring to FIG. 6, the resistant coating 19 is then removed, e.g., by etching, and an electrical metal contact 27 is applied, e.g., by evaporating, sputtering or laminating, to major surface 12 to make ohmic contact to P+ dopant region 14. As shown, the contact 27 may consist or comprise a foil or strip of an aluminum alloy, for example, affixed to surface 12 by heating body 10 with the foil or strip in place in an inert atmosphere at about 700°C. so that a diffusion bond is formed between the body and the foil. Alternatively, metal contact 27 may be affixed to surface 12 by a solder layer (not shown) composed of either a hard solder (i.e., having a melting point above 375°C.) such as silver-tin or gold alloy, or a soft solder (i.e., having a melting point below 775°C.) such as tin.

Figure 7:
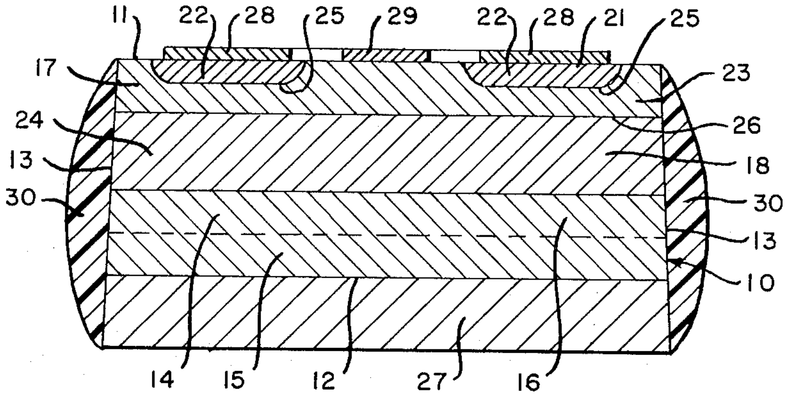

As shown in FIG. 7, a complete transistor is then produced. An annular metal contact 28 is affixed at surface 11 to make ohmic contact with second P+ dopant region 21 and a circular metal contact 29 is affixed at surface 11 to make ohmic contact with N-dopant region 17. Preferably, contacts 28 and 29 are affixed by selectively masking and thereafter evaporating aluminum onto surface 11 to a thickness of about 30,000 Angstroms. Thereafter, body 10 is spun-etched by known procedures to champfer side surfaces 13 to reduce edge leakage and edge voltage breakover during transistor operation. Then side surfaces 13 of semiconductor body 10 are coated with protective coating 30 formed by incorporating, for example, 1,2-dihydroxyanthraquinone (also called alizarin and lizaric acid) alone or in a silicone or epoxy resin to substantially reduce atmospheric effects on the transistor.

The finished PNP transistor has emitter region 22 corresponding to second P+ dopant region 21 and base region 23 corresponding to N-dopant region 17. PN junctions 25 and 26 are formed at the transition from second P+ dopant region 21 to N-dopant region 17, and from P-dopant region 18 to N-dopant region 17. The transistor also has collector region 22 comprised of three portions: First collector portion corresponds to P− dopant region 18 and comprises a substantially uniform level of P-type dopant corresponding to the residual level of dopant in the semiconductor body 10. Second collector portion corresponds to first dopant portion 15 of P+ dopant region 14 and comprises a high surface dopant concentration and steep dopant concentration gradient. Third intermediate collector portion corresponds to second dopant portion 16 of P+ dopant region 14 and comprises lower dopant concentrations than the second collector portion but higher than the first collector portion, and a shallower dopant concentration gradient than the second collector portion.

Figure 8:
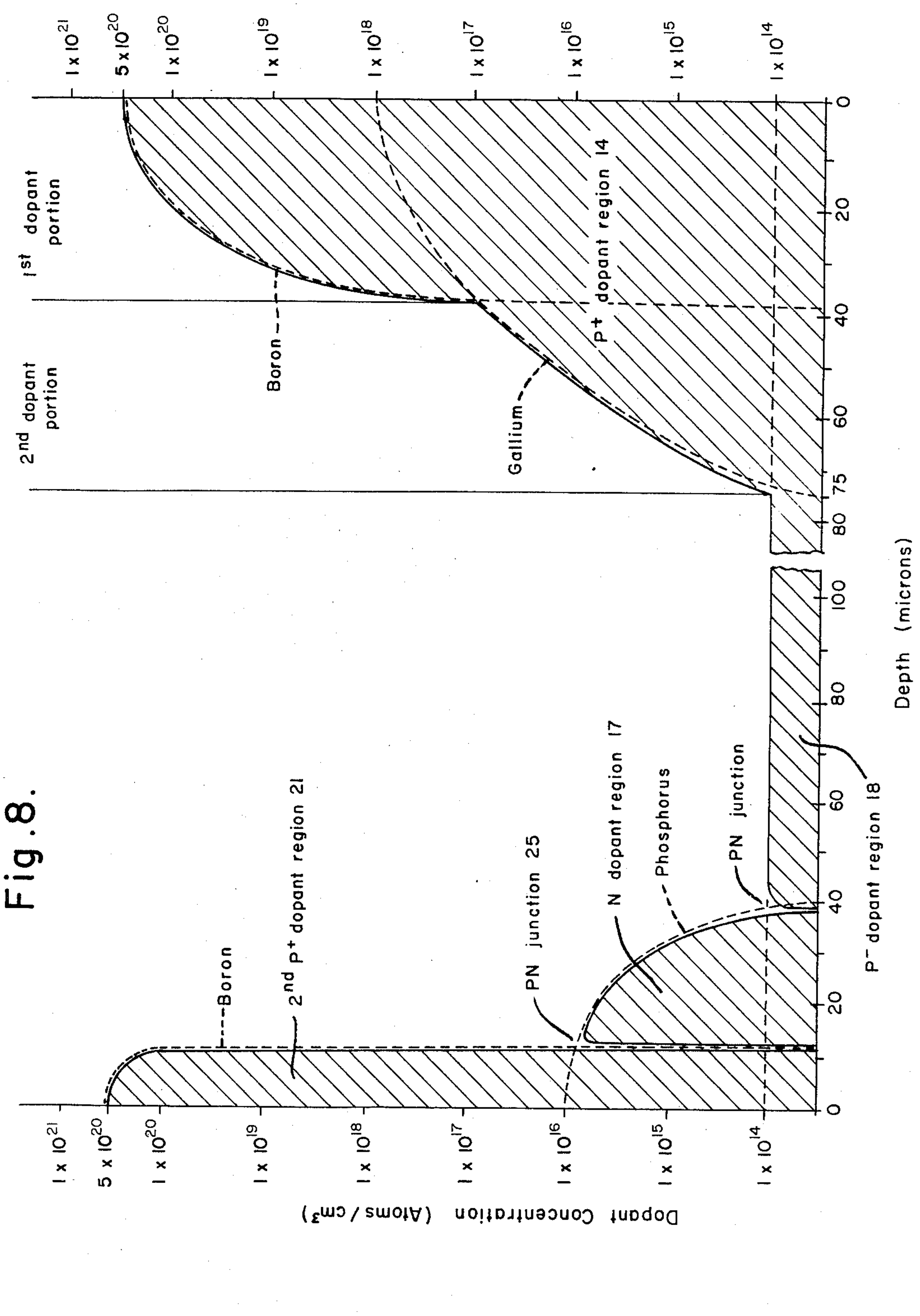
FIG. 8 is a doping concentration profile of the PNP transistor of FIG. 7.

The construction and operation of the finished transistor shown in FIG. 7 is more fully understood by reference to its doping concentration profile shown in FIG. 8. For the embodiment, the residual dopant level of the first collector portion is shown at $1 \times 10^{14}$ atoms/cm$^3$. The second collector portion has a high dopant concentration of $5 \times 10^{20}$ atoms/cm$^3$ at surface 12 and consists essentially of boron; it also has a steep dopant concentration gradient of about $1.25 \times 10^{23}$ atoms/cm$^4$ (a 40 micron depth diffusion of $5 \times 10^{20}$ atoms/cm$^3$ surface concentration). The third intermediate collector portion has lower dopant concentrations, ranging from $1 \times 10^{14}$ to $1 \times 10^{17}$ atoms/cm$^3$, than the second collector portion ($1 \times 10^{17}$ to $5 \times 10^{20}$ atoms/cm$^3$) but higher than the first collector portion ($1 \times 10^{14}$ atoms/cm$^3$), and consists essentially of gallium; it also has a shallower dopant concentration gradient of $1.3 \times 10^{20}$ atoms/cm$^4$ (a 75 micron depth diffusion of $1 \times 10^{18}$ atoms/cm$^3$ surface concentration) than the second collector portion. In addition, base region 23 is shown to consist of phosphorus and arise from a diffusion having a surface concentration of $1 \times 10^{16}$ atoms/cm$^3$, and emitter region 22 is shown to consist of boron and arise from a diffusion having a surface concentration of $5 \times 10^{20}$ atoms/$cm^3$.

It follows from the doping profile that the reverse breakdown voltage is supported primarily by the first collector portion of the collector region. The carrier depletion region may extend into the third collector portion during on-state operation, but that portion is intended to support the high surge voltages encountered on switching of the transistor. Preferably therefore, the residual level of dopant throughout the semiconductor body is selected so that the design breakdown voltage under on-state conditions is supported in the first collector region. The width of the first collector region should not, however, be larger than the carrier depletion width necessary to support the desired on-state reverse breakdown voltage so that the surge voltage is supported by the shallow dopant concentration gradient of the third collector region.

While the invention has been specifically described with relation to diffusion methods, the invention can also be made by epitaxial techniques. This alternative permits the making of NPN transistors as well as PNP transistors embodying the present invention. Moreover, the epitaxial method has the advantage of more flexible and precise control of dopant concentration gradients in the second and third collector portions of the collector regions. In making a transistor of the present invention by epitaxial growth, the width of a semiconductor body corresponding to the design width of the first collector portion is grown in the manner as the body or wafer used in the diffusion technique above described. The third and second collector portions of the collector region, and the base and emitter regions are thereafter sequentially grown on the opposed major surfaces of the semiconductor body.

While the presently preferred embodiment of the invention and methods of performing it have been specifically described, it is distinctly understood that the invention may be otherwise variously embodied and used within the scope of the following claims.

What is claimed is:

1. A transistor having improved surge voltage capabilities comprising: a silicon semiconductor body having two opposed major surfaces and a resistivity of at least about 30 ohm-centimeters; and a collector region in said body adjoining one said major surface and comprising three portions, the first collector portion adjoining a PN junction and having a substantially uniform dopant concentration corresponding to the resistivity of the body to support a reverse breakdown voltage in the transistor, a second collector portion adjoining said major surface and having a dopant concentration of at least $1 \times 10^{19}$ atoms per cubic centimeter at said major surface and a steep dopant concentration gradient to provide for good ohmic and thermal contact properties, and a third collector portion intermediate said first and second collector portions and having higher dopant concentrations than said first collector portions but lower than said second collector portion and having a shallower dopant concentration gradient than said second collector portion to provide surge voltage capacity in the transistor without reverse voltage breakdown.

2. A transistor having improved surge voltage capabilities at set forth in claim 1 wherein said collector region is comprised of P-conductive type dopant, the second portion of said collector region is doped with boron, and the third, intermediate collector portion of said collector region is doped with at least one dopant selected from the group consisting of gallium and aluminum.

3. A method of making a PN transistor having improved surge voltage capabilities comprising the sequential steps of: disposing a silicon semiconductor body having a substantially uniform P-type dopant concentration therethrough and opposed major surfaces in a diffusion furnace; diffusing through a major surface into the semiconductor body boron and at least one dopant selected from the group consisting of gallium and aluminum to form a collector region adjoining the major surface comprised of three portions, first collector portion comprised of said uniform P-type dopant concentration, second collector portion being doped with boron, and third collector portion being doped with at least one dopant selected from the group consisting of gallium and aluminum; diffusing through the opposed major surface into the semiconductor body an N-type dopant to form a base region in said semiconductor body; diffusing through selected portions of said major surface adjoining the base region to form an emitter region in the semiconductor body adjoining said major surface; and affixing metal contacts to the semiconductor body to separately make ohmic contact with the emitter region, the base region, and the collector region.

4. The method of making a PNP transistor as set forth in claim 3 wherein: the boron and the member of said group are simultaneously diffused through at least one of the major surfaces.

* * * * *